United States Patent
Arvind et al.

(10) Patent No.: US 12,149,116 B2
(45) Date of Patent: Nov. 19, 2024

(54) METHOD AND SYSTEM FOR ENERGY MANAGEMENT OF HYBRID POWER SYSTEMS

(71) Applicants: Cummins Inc., Columbus, IN (US); Ramya vyas Arvind, Columbus, IN (US); Patrick J. Shook, Franklin, IN (US)

(72) Inventors: Ramya vyas Arvind, Columbus, IN (US); Patrick J. Shook, Franklin, IN (US)

(73) Assignee: Cummins Inc., Columbus, IN (US)

( * ) Notice: Subject to any disclaimer, the term of this patent is extended or adjusted under 35 U.S.C. 154(b) by 945 days.

(21) Appl. No.: 17/251,603

(22) PCT Filed: Jun. 13, 2019

(86) PCT No.: PCT/US2019/036930
§ 371 (c)(1),
(2) Date: Dec. 11, 2020

(87) PCT Pub. No.: WO2019/241491
PCT Pub. Date: Dec. 19, 2019

(65) Prior Publication Data
US 2021/0273477 A1    Sep. 2, 2021

Related U.S. Application Data

(60) Provisional application No. 62/684,500, filed on Jun. 13, 2018.

(51) Int. Cl.
*B60L 3/00* (2019.01)
*B60L 3/12* (2006.01)
(Continued)

(52) U.S. Cl.
CPC ............ *H02J 7/1446* (2013.01); *B60L 58/12* (2019.02); *B60W 10/08* (2013.01);
(Continued)

(58) Field of Classification Search
CPC . B60W 10/08; B60W 2510/244; B60L 58/12; B60L 3/12; B60L 2200/32;
(Continued)

(56) References Cited

U.S. PATENT DOCUMENTS

| | | | |
|---|---|---|---|
| 5,070,832 | A | 12/1991 | Hapka et al. |
| 5,910,722 | A | 6/1999 | Lyons et al. |

(Continued)

FOREIGN PATENT DOCUMENTS

| | | |
|---|---|---|
| EP | 3191337 A1 | 7/2017 |
| WO | 2016/038276 A1 | 3/2016 |

OTHER PUBLICATIONS

International Search Report and Written Opinion issued by the ISA/US, Commissioner for Patents, dated Aug. 19, 2019, for International Application No. PCT/US2019/036930; 9 pages.

*Primary Examiner* — Ian Jen
*Assistant Examiner* — Hossam M ABD El Latif
(74) *Attorney, Agent, or Firm* — Faegre Drinker Biddle & Reath LLP

(57) ABSTRACT

A system and method for energy management of hybrid power generation systems is provided. In some implementations, an energy power management system (EPMS) may receive information indicating a health event for a hybrid power generation system comprising a battery. The EPMS may modify a battery charging condition based on the information indicating the health event. Further, the EPMS may direct the hybrid power generation system to charge the battery based on a state of charge (SOC) of the battery and the modified battery charging condition. Also, the EPMS (Continued)

may direct the hybrid power generation system to modify one or more system parameters based on the modified battery charging condition.

14 Claims, 11 Drawing Sheets

(51) Int. Cl.
| | |
|---|---|
| *B60L 50/15* | (2019.01) |
| *B60L 58/12* | (2019.01) |
| *B60L 58/13* | (2019.01) |
| *B60L 58/16* | (2019.01) |
| *B60W 10/08* | (2006.01) |
| *G01R 31/382* | (2019.01) |
| *H02J 7/00* | (2006.01) |
| *H02J 7/04* | (2006.01) |
| *H02J 7/14* | (2006.01) |
| *H02J 9/08* | (2006.01) |

(52) U.S. Cl.
CPC .......... *G01R 31/382* (2019.01); *H02J 7/0068* (2013.01); *H02J 7/00712* (2020.01); *B60W 2510/244* (2013.01)

(58) Field of Classification Search
CPC ........... B60L 2240/36; B60L 2240/485; B60L 3/0061; B60L 50/15; B60L 58/16; B60L 58/13; G01R 31/382; H02J 7/1446; H02J 7/0068; H02J 7/00712; H02J 2310/12; H02J 2310/42; H02J 2310/04; H02J 9/08; H02J 7/04; H02J 7/14; Y02T 10/7072; Y02T 10/70; Y02T 10/92
USPC .......................................................... 701/22
See application file for complete search history.

(56) References Cited

U.S. PATENT DOCUMENTS

| | | | |
|---|---|---|---|
| 5,929,595 A | 7/1999 | Lyons et al. | |
| 5,941,328 A | 8/1999 | Lyons et al. | |
| 6,116,368 A | 9/2000 | Lyons et al. | |
| 6,166,517 A * | 12/2000 | Wakashiro | B60W 30/18027 320/132 |
| 6,646,845 B1 | 11/2003 | Turner et al. | |
| 7,679,336 B2 | 3/2010 | Gale et al. | |
| 8,269,641 B2 | 9/2012 | Bauman et al. | |
| 8,775,008 B2 | 7/2014 | Rini et al. | |
| 9,008,883 B2 | 4/2015 | Ichimoto | |
| 9,381,822 B2 | 7/2016 | Scheucher | |
| 9,707,857 B2 | 7/2017 | Chang et al. | |
| 2008/0203973 A1* | 8/2008 | Gale | B60L 53/64 320/155 |
| 2009/0192700 A1 | 7/2009 | Votoupal et al. | |
| 2010/0228423 A1* | 9/2010 | Howell | G05B 19/0428 701/31.4 |
| 2011/0298624 A1* | 12/2011 | Bauman | H02J 7/14 320/109 |
| 2015/0105947 A1 | 4/2015 | Chang et al. | |
| 2015/0329008 A1 | 11/2015 | Karlson et al. | |
| 2015/0367837 A1 | 12/2015 | Tamai et al. | |
| 2016/0061173 A1 | 3/2016 | Chuah et al. | |
| 2016/0207418 A1* | 7/2016 | Bergstrom | B60G 3/06 |
| 2017/0369048 A1* | 12/2017 | Delobel | H02J 7/04 |
| 2019/0226420 A1 | 7/2019 | Garimella et al. | |
| 2019/0344774 A1* | 11/2019 | Pursifull | B60W 20/13 |
| 2020/0101965 A1* | 4/2020 | Yang | B60L 58/20 |
| 2021/0288514 A1* | 9/2021 | Wen | H02J 7/007182 |

* cited by examiner

METHOD AND SYSTEM FOR ENERGY MANAGEMENT OF HYBRID POWER SYSTEMS

CROSS-REFERENCE TO RELATED APPLICATION

This application claims priority to Provisional Application No. 62/684,500, filed Jun. 13, 2018, which is herein incorporated by reference in its entirety.

FIELD OF THE DISCLOSURE

The present disclosure generally relates to control systems for computing devices, and more specifically to energy management of hybrid power systems.

BACKGROUND OF THE DISCLOSURE

Hybrid power generation systems may include hybrid vehicles and/or a gensets (e.g., generator and engine used to generate electrical energy). For example, a hybrid power generation system may include a hybrid control system, a battery, a generator, and an engine (e.g., a diesel engine). The hybrid control system may direct the battery and/or the engine/generator to provide power to a load (e.g., to move the vehicle or to provide electrical power to a residence). Additionally, in some instances, the engine/generator may also provide power to recharge the battery. For instance, currently, when a state of charge (SOC) for the battery is below a minimum charging threshold, the hybrid control system may direct the engine/generator to recharge the battery to a maximum charging threshold.

However, over time, the engine/generator may wear down and/or the battery may degrade. For example, initially, a battery's maximum SOC may last eight hours. But, over time and due to the battery's degradation, the battery's maximum SOC might last only four hours. Additionally, and/or alternatively, severe conditions, such as weather-related conditions and/or natural disasters, may cause more usage of a battery than normal. As such, it may be desirable to develop a hybrid control system that modifies the SOC threshold of the battery and/or provide hybrid power system commands to eliminate or alleviate one or more operational disadvantages described above.

SUMMARY OF THE DISCLOSURE

In some embodiments, the present disclosure provides a system and method for energy management of hybrid power generation systems. For example, a hybrid control system (e.g., one or more devices) may receive information indicating a health event for a hybrid power generation system comprising a battery. The hybrid control system may modify a battery charging condition based on the information indicating the health event. Further, the hybrid control system may direct the hybrid power generation system to charge the battery based on a SOC of the battery and the modified battery charging condition. Also, the hybrid control system may direct the hybrid power generation system to modify one or more system parameters based on the modified battery charging condition.

In some embodiments, the information received by the hybrid control system indicates one or more system operation conditions, and the battery charging condition is modified based on the one or more system operation conditions. In some embodiments, the information received includes prognostic information, and the battery charging condition is modified based on the prognostic information. In some aspects of the embodiment, the prognostic information includes a prognostic enabled condition. In some aspects of the embodiment, the information further includes diagnostic information, and the battery charging condition is also modified based on the diagnostic information. In some embodiments, the information received includes learned and look-ahead information, and the battery charging condition is modified based on the learned and look-ahead information. In some embodiments, the information received includes current and prior system health information, and the battery charging condition is modified based on the current and prior system health information. In some embodiments, the information received includes current and prior charging system information, and the battery charging condition is modified based on the current and prior charging system information. In some embodiments, the information received includes external information, and the battery charging condition is modified based on the external information. In some embodiments, the battery charging condition includes one or both of a maximum charging threshold and a minimum charging threshold of the battery, and the battery charging condition is modified by increasing or decreasing the one or both of the maximum and minimum charging thresholds based on the information received.

While multiple embodiments are disclosed, still other embodiments of the present disclosure will become apparent to those skilled in the art from the following detailed description, which shows and describes illustrative embodiments of the present disclosure. Accordingly, the drawings and detailed description are to be regarded as illustrative in nature and not restrictive.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

Figure 1:
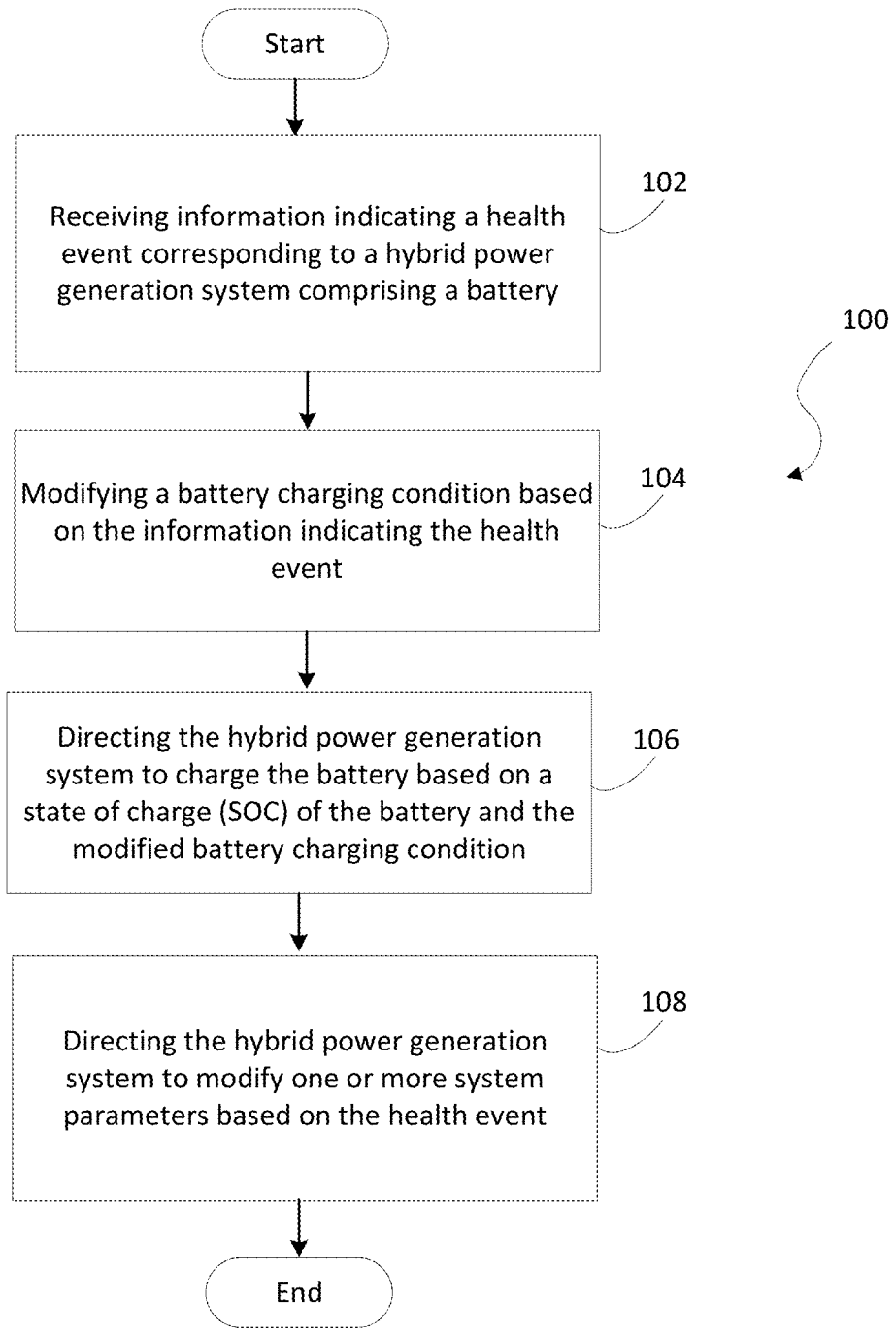
FIG. 1 shows a flow chart illustrating a method for energy management of hybrid power systems in accordance with one or more embodiments set forth in the disclosure.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which is shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Figure 2:
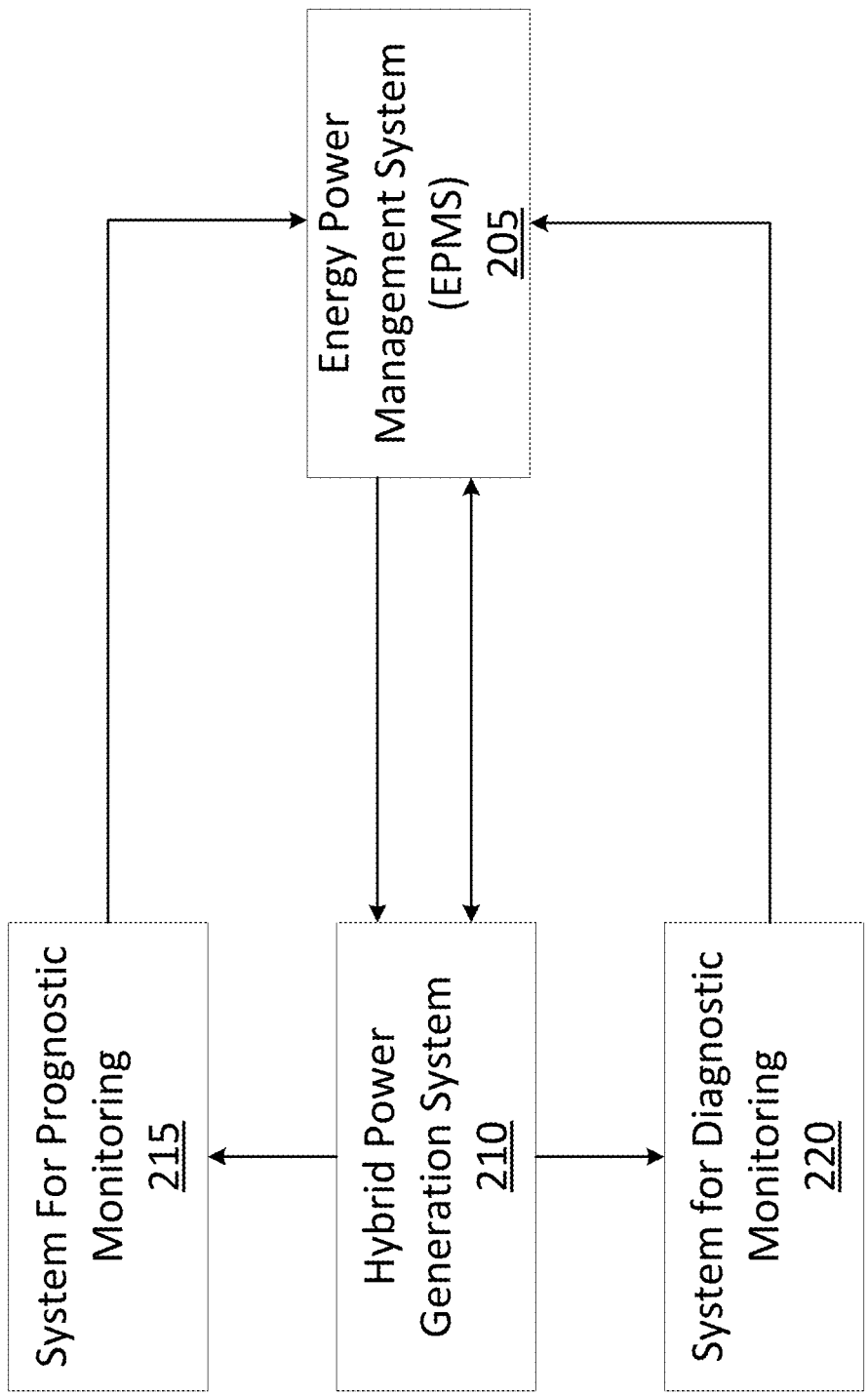
FIG. 2 shows a schematic block diagram illustrating a system for energy management of hybrid power systems in accordance with one or more embodiments set forth in the disclosure.

FIG. 1 shows one example of a method 100 for energy management of hybrid power systems. FIG. 1 will be described below with reference to the system 200 illustrated in FIG. 2. However, any suitable system or structure may be employed. FIG. 2 will be explained first, and the operation of FIG. 1 will be described after. FIG. 2 shows one example of a system 200 for energy management of hybrid power systems. Referring to FIG. 2, the system 200 may include an energy power management system (EPMS) 205, a hybrid power generation system 210, a system for prognostic monitoring 215, and a system for diagnostic monitoring 220.

In some implementations, the energy power management system (EPMS) 205 may be any suitable type of module, apparatus, system, or device suitable for implementing aspects of embodiments of the disclosed subject matter. Examples of the energy power management device 205 may include, but are not limited to workstations, servers, cloud computing platforms, laptops, desktops, tablet computers, hand-held devices, game consoles, general-purpose units, state machines, APUs, CPUs, GPUs, engine control modules (ECMs), and the like, all of which are contemplated with the scope of the energy power management device 205.

The energy power management device 205 may be in communication with and control one or more systems, apparatuses and/or devices within the hybrid energy system 200. For example, as will be explained below, the EPMS 205 may be configured to produce control signals and/or transmit (e.g., provide) the control signals to control the operation of the hybrid energy system 200. For instance, in some implementations, the EPMS 205 may receive (e.g., obtain, retrieve) information, such as diagnostic information, prognostic information, battery charging (SOC) information, and/or health event information, from one or more systems (e.g., the system for prognostic monitoring 215 and/or the system for diagnostic monitoring 220). In response to the information, the EPMS 205 may generate, transmit, and/or provide one or more command signals directing the hybrid power generation system 210 to modify one or more parameters and/or to modify a SOC of a battery (e.g., a battery within the hybrid power generation system 210).

Figure 3:
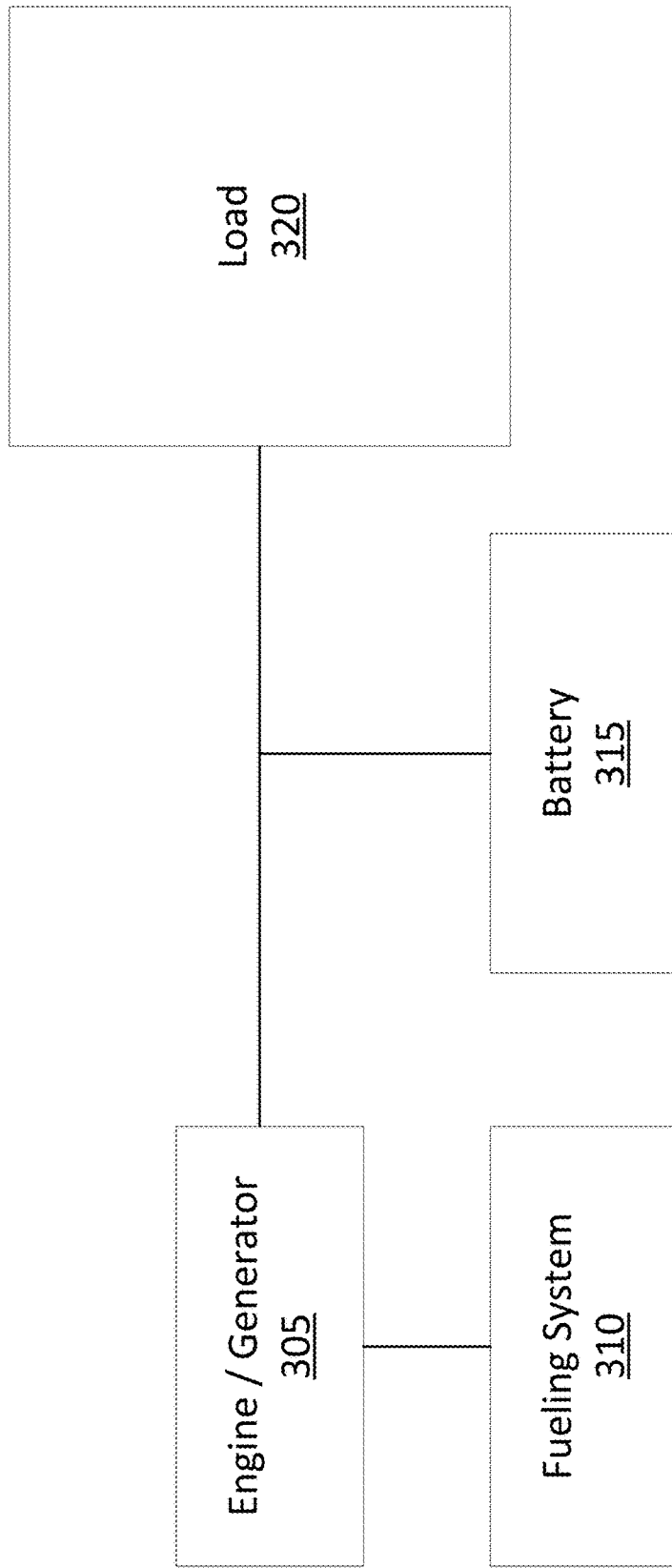
FIG. 3 shows a schematic block diagram illustrating a hybrid power generation system in accordance with one or more embodiments set forth in the disclosure.

The hybrid power generation system 210 may be any suitable type of system that generates and/or uses hybrid power. FIG. 3 shows one example of a hybrid power generation system 210. For example, the hybrid power generation system 210 may include one or more engines/generators 305, a fueling system 310, one or more batteries 315, and/or one or more loads 320.

The fueling system 310 may provide fuel, such as diesel fuel, to the engines/generators 305. The engines/generators 305 may provide power (e.g., electrical power) to the battery 315 and/or the load 320. Further, the battery 315 may also provide power (e.g., electrical power) to the load 320. In some instances, the engine/generator 305 may provide power to the battery 315 to recharge the battery 315. For example, one or more components of the hybrid power generation system 210 may transmit information, such as SOC information indicating the SOC of the battery is below a minimum threshold, to the EPMS 205. In response to the information, the EPMS 205 may transmit (e.g., provide) a command directing the hybrid power generation system 210 to recharge the battery (e.g., for the engine/generator 305 to recharge the battery 315).

Referring back to FIG. 2, the system for prognostic monitoring 215 may include any suitable type of apparatus, system, sensors, and/or devices suitable for implementing aspects of embodiments of the disclosed subject matter. For example, the system for prognostic monitoring 215 may include one or more sensors and/or devices configured to monitor a prognostic state of the hybrid power generation system 210. In some implementations, the system for prognostic monitoring 215 may monitor the hybrid power generation system 210 to determine conditions and/or health events for the hybrid power generation system 210. For instance, the system for prognostic monitoring 215 may determine a life expectancy of a component, such as one or more components, devices, and/or systems within the hybrid power generation system 210. Further, the system for prognostic monitoring 215 may determine that the component will fail within a certain time period, such as the next two days. The system for prognostic monitoring 215 may transmit the prognostic information and/or health event (e.g., the component will fail in two days) to the EPMS 205. The EPMS 205 may direct the hybrid power generation system 210 to modify one or more system parameters and/or a battery charging conditions based on the prognostic information. The system for prognostic monitoring 215 will be described in further detail below.

The system for diagnostic monitoring 220 may include any suitable type of apparatus, system, sensors, and/or devices suitable for implementing aspects of embodiments of the disclosed subject matter. For example, the system for diagnostic monitoring 220 may include one or more sensors and/or devices configured to monitor a diagnostic state of the hybrid power generation system 210. In some implementations, the system for diagnostic monitoring 220 may monitor the hybrid power generation system 210 to determine conditions and/or health events for the hybrid power generation system 210. For instance, the system for diagnostic monitoring 220 may determine whether a component is failing (e.g., whether one or more components, devices, and/or systems within the hybrid power generation system 210 is failing). The system for diagnostic monitoring 220 may transmit the diagnostic information and/or health event (e.g., the component is failing) to the EPMS 205. The EPMS 205 may direct the hybrid power generation system 210 to modify one or more system parameters and/or a battery charging conditions based on the diagnostic information. The system for diagnostic monitoring 220 will be described in further detail below.

The hybrid energy system 200 may be any type of hybrid system, including, but not limited to land-based hybrid vehicles, marine-based hybrid vehicles, and/or gensets. For example, in some instances, hybrid energy system 200 may be a hybrid system for a land-based hybrid vehicle. The land-based hybrid vehicle may include, but is not limited to, a car, truck, train, and/or a locomotive/mine-haul truck hybrid system. For example, in some implementations, the load 320 may include one or more hybrid vehicle components. The load 320 may include traction, ground-engaging members, such as one or more wheels, and/or a powertrain system. The engine/generator 305 and/or the battery 315 may provide hybrid power to the traction and/or wheels. The traction and/or wheels may move the land-based hybrid vehicle.

In some implementations, the land-based hybrid vehicle may also include power electronics (PEs), one or more motors/generators, and/or one or more hydraulic loads. The motors/generators may be connected (e.g., operatively coupled) to the hydraulic loads. Further, the motor/generator may connect to the PEs. The PEs may be connected to the engine/generator 305, the battery 315, and/or the load 320 (e.g., traction and/or wheels described above).

In some examples, the hybrid energy system 200 may be a hybrid system for a marine-based hybrid vehicle. The marine-based hybrid vehicle may be any vehicle that operates on or below water (e.g., submarine or ship). In some implementations, the load 320 may include one or more hybrid vehicle components. For example, the load 320 may include traction and/or rotors. The engine/generator 305 and/or the battery 315 may provide hybrid power to the traction and/or rotors to move marine-based hybrid vehicle.

In some implementations, the marine-based hybrid vehicle may include an energy storage component (e.g., battery), power electronics, an electric motor, a main propulsion engine, a hybrid ready gearbox, and/or a rotor. The energy storage may include functionalities of the battery 315. The energy storage may be connected to the power electronics and the power electronics may be connected to the electric motor. The electric motor may provide electrical energy to the hybrid ready gearbox. Further, the main propulsion engine may use fuel, such as diesel fuel, to provide another source of energy to the hybrid ready gearbox. The hybrid ready gearbox may provide power to move the rotor. Additionally, and/or alternatively, the main propulsion engine may further provide power to recharge the energy storage. This may be described in further detail below.

In some embodiments, the hybrid energy system 200 may be a hybrid genset system. For example, the hybrid genset system may include a combination of one or more engines, electric generators, alternators, and/or gear boxes. Further, the EPMS 205 may include genset controls to control the hybrid genset system. The hybrid genset system may be used to generate energy (e.g., electricity). For example, the hybrid genset system may use renewable energy (e.g., green energy), a direct current (DC) battery source (e.g., DC battery 315), and/or an alternate current (AC) battery source (e.g., AC battery 315) to generate energy for residential and/or commercial buildings. Referring to FIG. 3, the battery 315 and/or the engine/generator 305 may be included within the hybrid genset system. Further, the hybrid genset system may include one or more batteries 315, such as one or more battery racks. The EPMS 205 may determine conditions of the one or more battery racks and change the thresholds and/or charging characteristics of the battery racks of the hybrid genset system. The load 320 may be any type of load connected to the hybrid genset system and the hybrid genset system may provide power to the load 320. The operation of the system, including the land-based hybrid vehicle, the marine based hybrid vehicle, and/or the hybrid genset system, will be described in further detail below.

In some instances, the hybrid energy system 200 may include a green energy power generation system. For example, the green energy power generation system may be a wind-turbine system, a solar panel system, and/or other sources of green energy. The EPMS 205 may direct the green energy power generation system to provide energy to the hybrid power generation system 210. For example, the EPMS 205 may direct the green energy power generation system to provide energy to the load 320. Additionally, and/or alternatively, the battery 315 may be recharged by the engine/generator 305 and/or the green energy power generation system. For example, the green energy power generation system may generate renewable energy and the EPMS 205 may direct the green energy power generation system to recharge the battery 315 using the renewable energy.

Referring back to FIG. 1, in operation, at step 102, the EPMS 205 may receive information indicating a health event corresponding to a hybrid power generation system 210 comprising a battery 315. For example, the EPMS 205 may receive health events (e.g., diagnostic and/or prognostic information) from the system for prognostic monitoring 215, the hybrid power generation system 210 and/or the system for diagnostic monitoring 220. In some examples, the EPMS 205 may use the prognostic information to determine or predict future issues of the hybrid power generation system 210. The prognostic information will be described in more detail below. In some instances, the EPMS 205 may use the diagnostic information to determine current problems and/or issues of the hybrid power generation system 210.

In some implementations, the EPMS 205 may receive the diagnostic and/or prognostic information from an engine friction monitoring system, a mechanical fatigue recognition system, a fuel injector cavitation system, and/or an after treatment health management system. For example, the engine friction monitoring system may monitor the hybrid power generation system 210 (e.g., the engine) and provide information (e.g., diagnostic and/or prognostic information such as temperature of the system) to the EPMS 205. Similarly, the mechanical fatigue recognition system may monitor fatigue of the hybrid power generation system 210 and provide information to the EPMS 205. The fuel injector cavitation system and/or the after treatment health management system may also monitor the hybrid power generation system 210 and provide information to the EPMS 205. In some instances, the engine friction monitoring system, the mechanical fatigue recognition system, the fuel injector cavitation system, and/or the after treatment health management system may be included within the system for prognostic monitoring 215 and/or the system for diagnostic monitoring 220. Further, the above systems and the information received from the systems will be described in more detail below.

At step 104, the EPMS 205 may modify a battery charging condition based on the information indicating the health event (e.g., the diagnostic and/or prognostic information). For example, the battery charging condition may be one or more thresholds (e.g., minimum and/or maximum thresholds) for when the battery 315 begins and stops charging. Based on the health event, the EPMS 205 may change (e.g., increase or decrease) one or more of the thresholds (e.g., minimum or maximum thresholds). When the EPMS 205 detects the battery 315 is below the minimum threshold, the EPMS 205 may direct the hybrid power generation system 210 to begin charging the battery 315 (e.g., charging the battery 315 using the engine/generator 305). When the EPMS 205 detects the battery 315 reaches and/or is above the maximum threshold, the EPMS 205 may direct the hybrid power generation system 210 to stop charging the battery 315.

Figure 5:
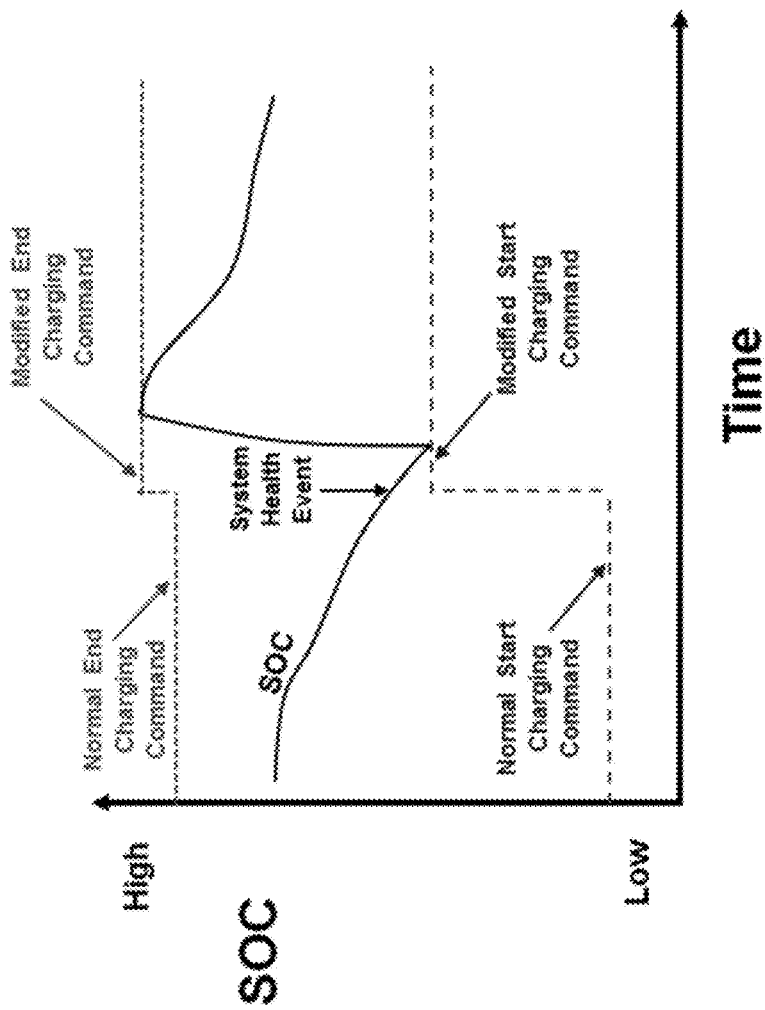
FIG. 5 shows an exemplary representation of charging characteristics of a battery in accordance with one or more embodiments set forth in the disclosure.

FIG. 5 shows an example of modifying battery charging conditions based on the health event. For example, FIG. 5 shows a SOC of the battery 315 over a period of time. Referring to FIG. 5, initially, the EPMS 205 might not receive any health events (e.g., diagnostic and/or prognostic information). In response to the EPMS 205 receiving the health event (e.g., the system health event), the EPMS 205 may modify the minimum and the maximum thresholds. As shown, the EPMS 205 may increase both the minimum and maximum thresholds from the normal start/end charging commands to the modified start/end charging commands.

Referring back to FIG. 1, at step 106, the EPMS 205 may direct the hybrid power generation system 210 to charge the battery based on a SOC of the battery 315 and the modified battery charging condition. For example, the EPMS 205 may receive the SOC of the battery 315 from the hybrid power generation system 210. The SOC may indicate the charge left in the battery 315. When the SOC reaches the modified battery charging condition (e.g., the modified start charging command shown in FIG. 5), the EPMS 205 may generate and/or transmit a command signal directing the hybrid power generation system 210 to begin recharging the battery 315. In response to the command signal, the hybrid power generation system 210 may direct the engine/generator 305 to begin charging the battery 315. Further, when the SOC reaches the second modified battery charging condition (e.g., the modified end charging command shown in FIG. 5), the EPMS 205 may generate and/or transmit a command signal directing the hybrid power generation system 210 to end recharging of the battery 315. In response to the command signal, the hybrid power generation system 210 may direct the engine/generator 305 to cease charging the battery 315.

At step 108, the EPMS 205 may direct the hybrid power generation system 210 to modify one or more system parameters based on the health event. For example, the modified one or more system parameters may extend the life and/or reduce the wear and tear of the components, devices, and/or systems within the hybrid power generation system 210 (e.g., the engine/generator 305 and/or the battery 315).

Figure 4:
FIG. 4 shows a schematic block diagram illustrating an energy power management module in accordance with one or more embodiments set forth in the disclosure.

Many embodiments of the method 100 and/or the system 200 will be described in further detail below; however, the embodiments below are not limiting and other embodiments of the method 100 and/or the system 200 are included herein. Further, in some examples, each implementation and/or embodiment may be combined together (e.g., receive one or more information sets and modify the battery charging thresholds and/or the system parameters based on the information sets). In other examples, each implementation or embodiment may be separate. Referring to FIG. 4, the EPMS 205 may receive information from the system for prognostic monitoring 215 and/or the system for diagnostic monitoring 220 that includes one or more conditions and/or information listed in FIG. 4. The EPMS 205 may receive one or more of the conditions and/or information listed in FIG. 4 and may use the information to modify the battery charging conditions, execute charging commands, modify system (e.g., hybrid energy system 200) parameters, and/or execute system commands.

In some implementations, at step 102, the EPMS 205 may receive information, such as external information indicating a health event. For example, the EPMS 205 may receive the external information from various different types of communication methods, such as a vehicle to a vehicle communication, a vehicle to an infrastructure (e.g., server) communication, a vehicle to another device or system communication, a machine (e.g., a hybrid genset system) to a vehicle communication, a machine to an infrastructure communication, and/or a machine to another device or system communication. For example, the external information may indicate natural disasters, such as earthquakes, and/or weather conditions, such as a hurricane, rain, or tornado, are occurring. Further, the external information may indicate future related weather events (e.g., a hurricane will hit land-fall in two hours).

Figure 6:
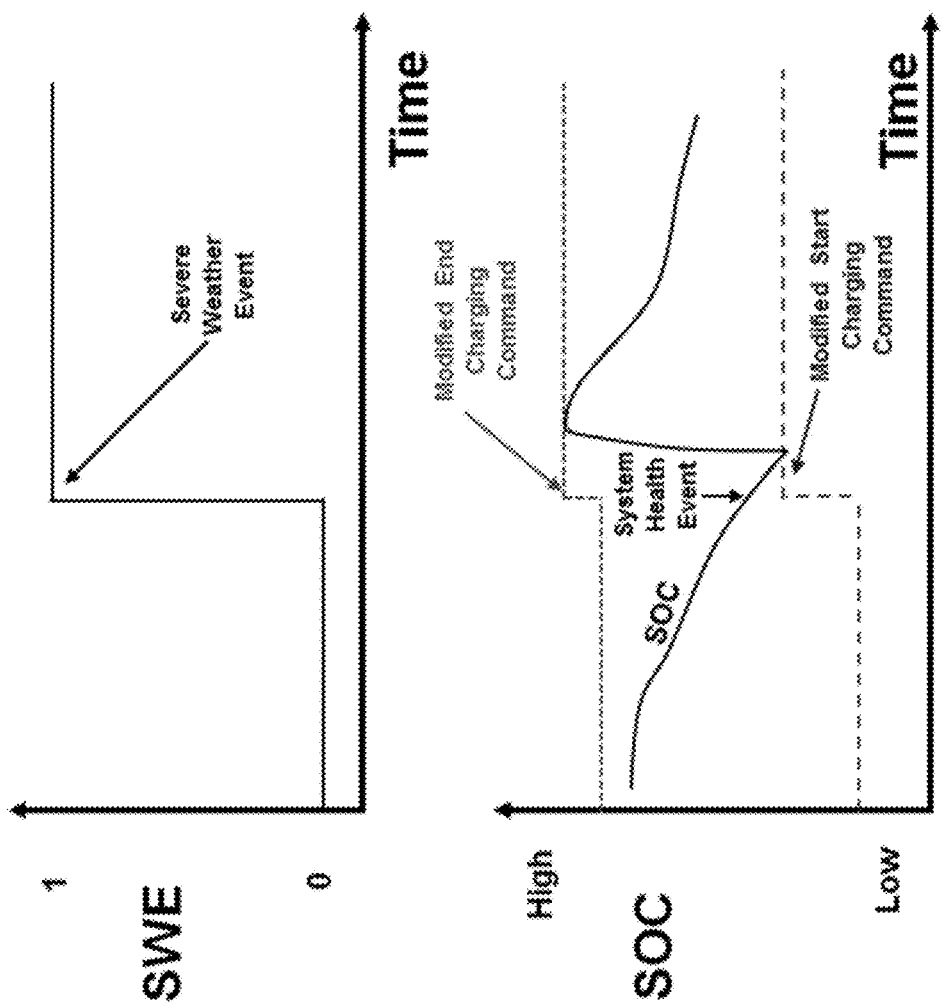
FIG. 6 shows another exemplary representation of charging characteristics of a battery in accordance with one or more embodiments set forth in the disclosure.

At step 104, the EPMS 205 may modify battery charging conditions based on the external event (e.g., hurricane). FIG. 6 shows an example of the EPMS 205 modifying the battery charging conditions in response to an external event. For example, depending on the external event, the EPMS 205 may change the value of the minimum and maximum charging thresholds for the battery 315. For instance, if the EPMS 205 determines from the external information that a hurricane is occurring or going to occur in a few hours, the EPMS 205 may raise the value of the minimum and maximum charging conditions. Thus, the battery 315 may be charged (e.g., by raising minimum charging threshold) and/or may hold a greater SOC when the external event (e.g., hurricane) occurs. In some examples, the EPMS 205 may increase or decrease the value of the minimum and maximum charging conditions differently based on different external events. For example, the EPMS 205 may change the minimum and/or maximum threshold charging conditions to first values when detecting a hurricane and change them to different, second values when detecting a natural disaster, such as a tornado.

In some implementations, at step 102, the EPMS 205 may receive information, such as current and prior charging system information. For example, the EPMS 205 may receive current and prior charging system information indicating a length of time the system 200 previously charged the battery 315 from the minimum charging threshold to the maximum charging threshold. For instance, the EPMS 205 may measure the time the SOC of the battery 315 went from the minimum charging threshold to the maximum charging threshold. Additionally, and/or alternatively, the EPMS 205 may average the previous number of times (e.g., ten) the battery went from the minimum to maximum charging threshold.

At step 104, the EPMS 205 may modify battery charging conditions based on current and prior charging system information (e.g., previous charge time was 12 minutes). For example, the EPMS 205 may reduce the value of the minimum charging threshold. At step 108, the EPMS 205 may direct the hybrid power generation system 210 to modify one or more system parameters. For example, the EPMS 205 may direct the hybrid power generation system 210 to not charge the battery 315 with the engine/generator 305. Instead, the EPMS 205 may wait until a charge-in or plug-in opportunity to charge the battery 315. For example, the hybrid power generation system 210 and the battery 315 may include a wire or cord that plugs into a socket. The battery 315 may recharge using the charge-in or plug-in opportunity.

In some implementations, the EPMS 205 may receive information, such as SOC information. The SOC information may indicate a SOC of the battery 315. At step 106, using the SOC information, the EPMS 205 may direct the hybrid power generation system 210 to initiate and/or cease the recharging of the battery 315 as described above. Additionally, and/or alternatively, the EPMS 205 may use the plug-in opportunity and/or the green energy power generation system to initiate and/or cease the recharging of the battery 315.

Figure 7:
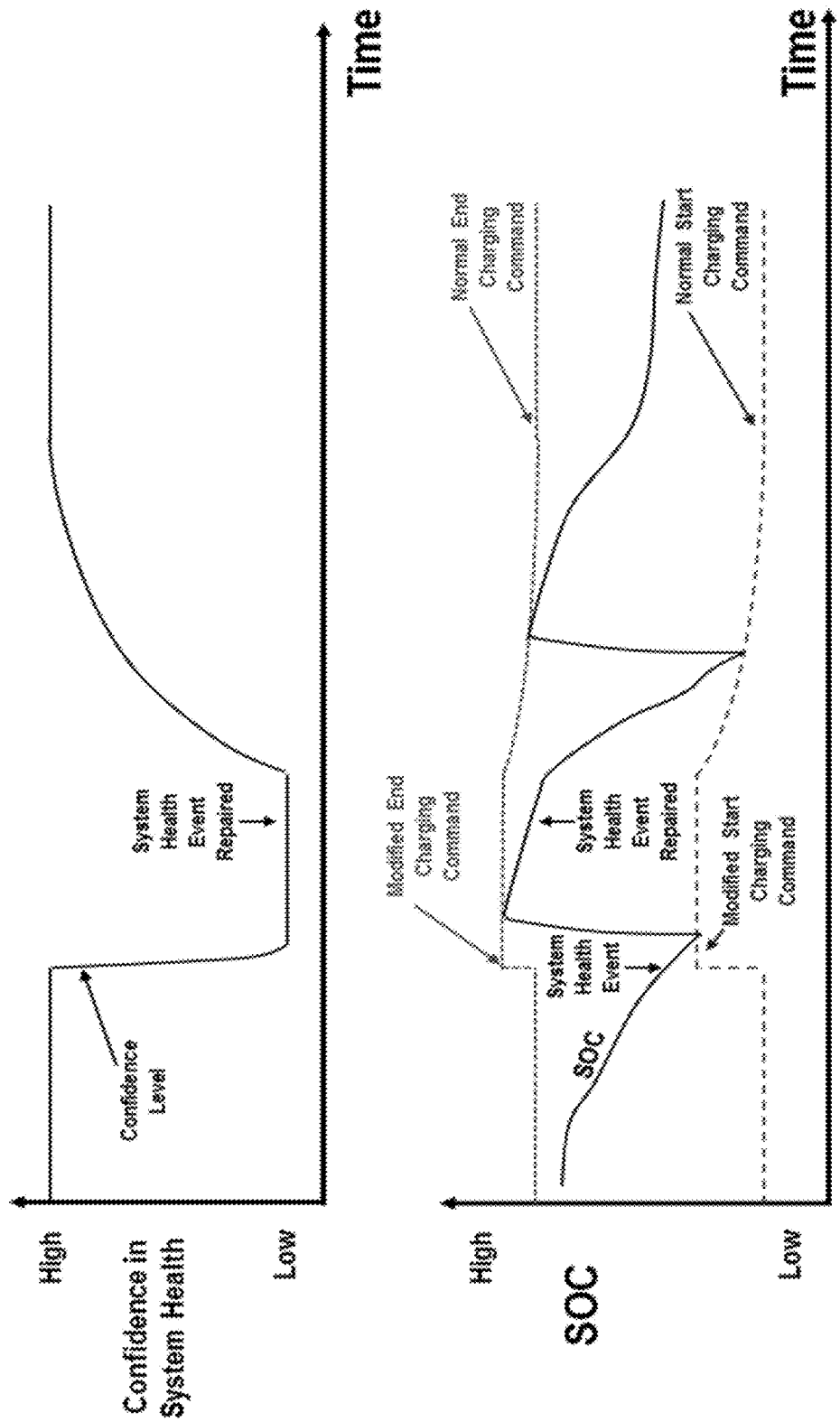
FIG. 7 shows another exemplary representation of charging characteristics of a battery in accordance with one or more embodiments set forth in the disclosure.

In some implementations, the EPMS 205 may receive information, such as current and prior health information corresponding to the hybrid power generation system 210. FIG. 7 shows an example of the EPMS 205 using the current and prior health information of the hybrid power generation system 210 over a period of time to modify battery charging conditions. For example, initially, the EPMS 205 may receive current health information indicating that the confidence of the health of the system 210 may be high, and may set the minimum and maximum charging thresholds as normal. Then, the EPMS 205 may receive information indicating a drop in the confidence level of system 210 (e.g., a system health event, such as a component of the hybrid power generation system 210 may be failing), and the EPMS 205 may modify the charging conditions by increasing the minimum and maximum charging conditions. Further, the EPMS 205 may detect that the SOC of the battery 315 reaches the modified minimum charging condition (e.g., the modified start charging command) and initiate recharging of the battery 315 as described above. The EPMS 205 may cease charging the battery 315 when detecting that the SOC of the battery 315 reaches the maximum charging threshold (e.g., the modified end charging command).

Then, method 100 may repeat again. For example, the EPMS 205 may receive further current and prior health information indicating the system health event has been addressed (e.g., at step 108, the EPMS 205 directs the hybrid power generation system to modify one or more parameters to address the system health event). In response, the EPMS 205 may modify the charging conditions. In some examples, the EPMS 205 may reduce the minimum and maximum charging thresholds by a pre-determined value. In other examples, such as the example shown in FIG. 7, the EPMS 205 may gradually reduce the minimum and maximum charging thresholds. For example, the confidence in the system's 210 health may be delayed and/or is implemented slowly in case the system health event re-occurs. As such, the EPMS 205 may gradually reduce the minimum and maximum charging thresholds as shown in FIG. 7.

In some implementations, at step 102, the EPMS 205 may receive information, such as learned and look-ahead information. For example, the EPMS 205 may receive learned and look-ahead information indicating a previous time of the day a plug-in event occurred (e.g., the battery 315 plugs into an outlet to recharge the battery 315). Additionally, and/or alternatively, the EPMS 205 may average the time of day a plug-in event occurred over a span of a few days, weeks, or years (e.g., the previous 10 days).

Figure 8:
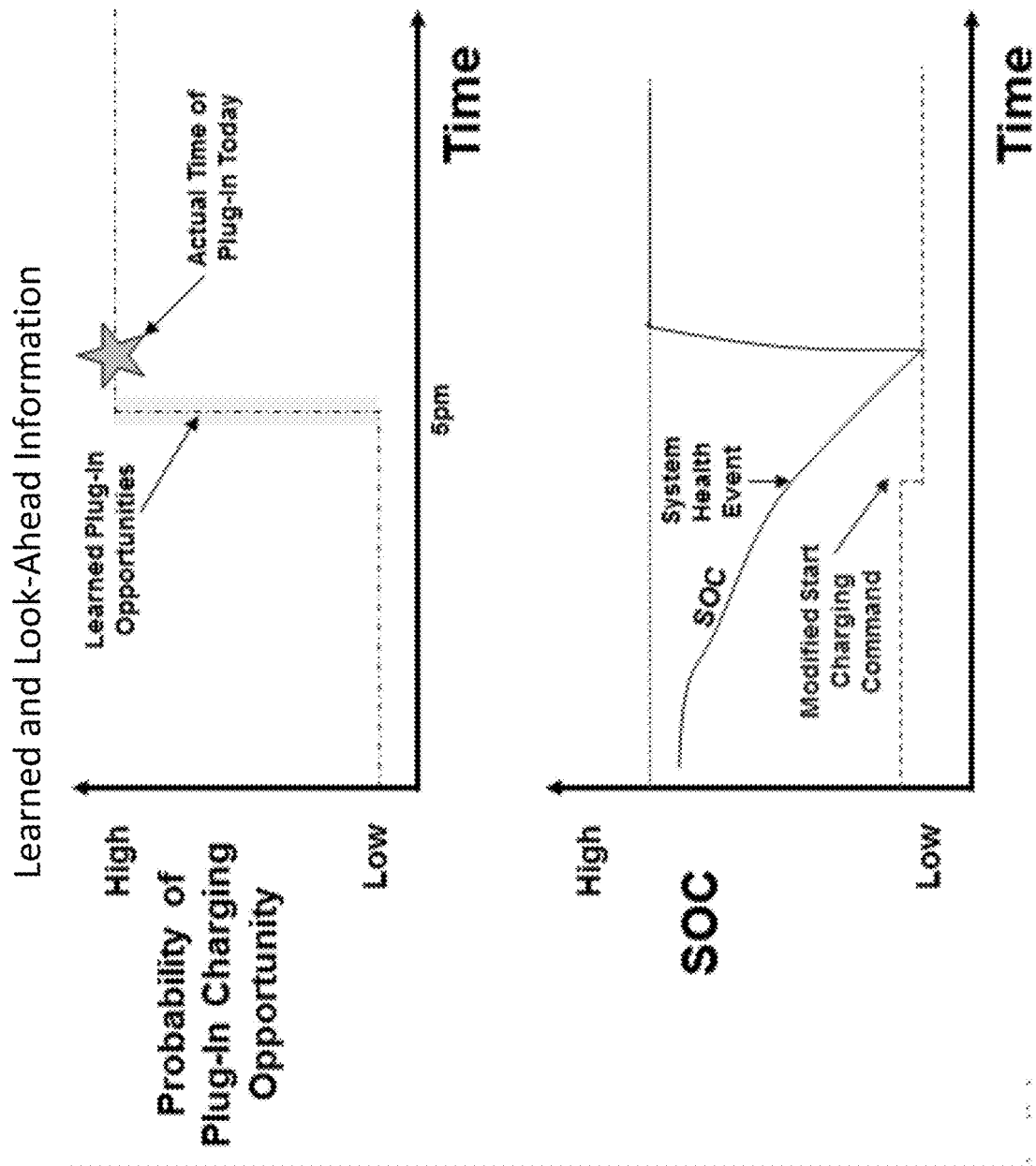
FIG. 8 shows another exemplary representation of charging characteristics of a battery in accordance with one or more embodiments set forth in the disclosure.

At step 104, the EPMS 205 may modify battery charging conditions based on learned and look-ahead information (e.g., the previous time of day that a plug-in event occurred). FIG. 8 shows an example of the EPMS 205 using the learned and look-ahead information to modify the battery charging conditions. For example, the previous time of day a plug-in event occurred may be at 5 PM. In response to the information indicating the previous time of day (e.g., 5 PM) that the plug-in event occurred, the EPMS 205 may modify the battery charging conditions by reducing the minimum threshold (e.g., the modified start charging command) a before 5 PM, such as 4:45 PM. For instance, the system 200 may be a vehicle and might not have arrived at a plug-in opportunity at 5 PM, but may be close to the plug-in opportunity. Therefore, rather than using the engine/generator to re-charge the battery 315, the EPMS 205 may reduce the minimum threshold to begin charging the battery 315. Thus, if the vehicle arrives at the plug-in opportunity at 5:15 PM, the EPMS 205 may use a plug-in event to recharge the battery 315 rather than using the engine/generator 305 to recharge the battery, which may cause improvement in engine efficiency.

Figure 9:
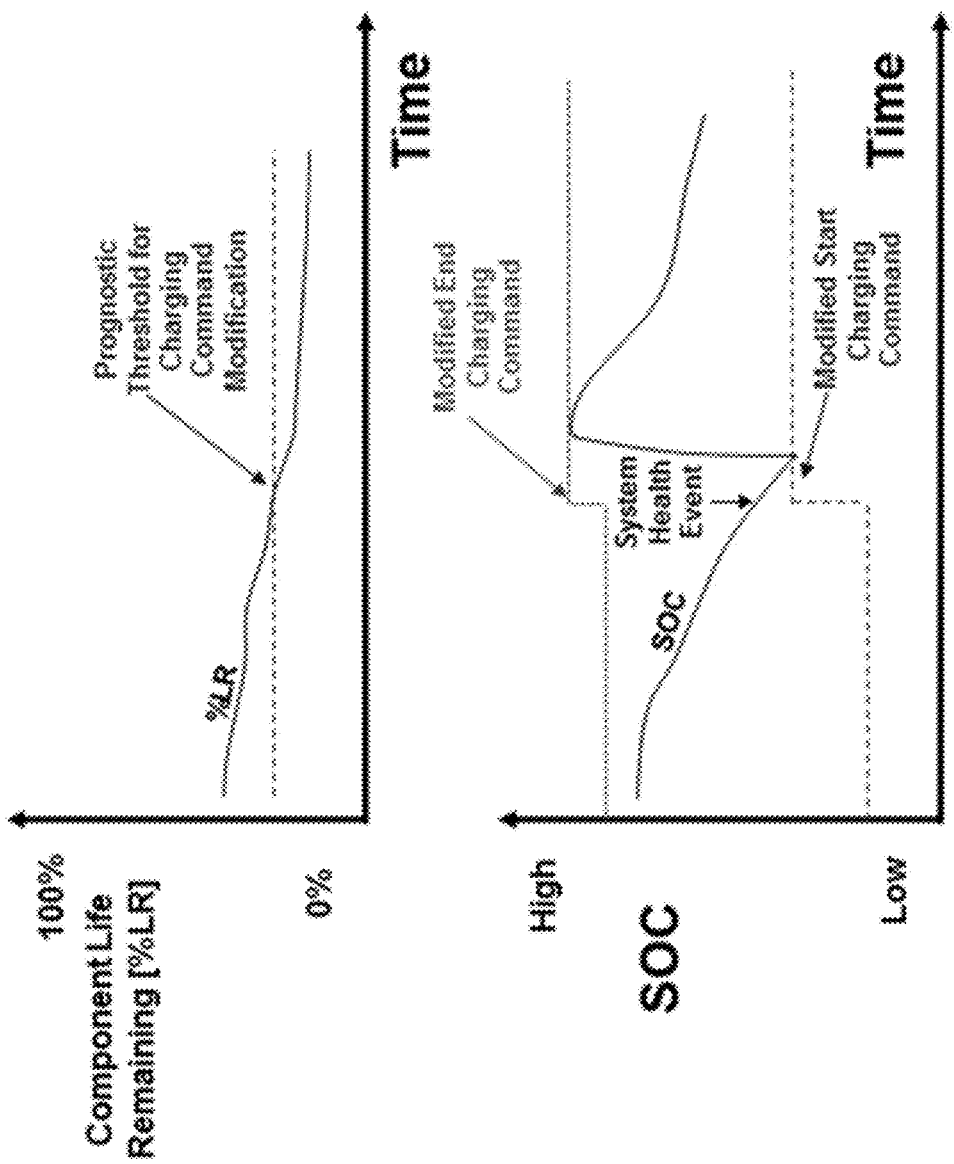
FIG. 9 shows another exemplary representation of charging characteristics of a battery in accordance with one or more embodiments set forth in the disclosure.

In some implementations, at step 102, the EPMS 205 may receive information, such as prognostic information. FIG. 9 shows an example of the EPMS 205 using the prognostic information to modify the battery charging conditions. For example, the EPMS 205 may receive prognostic information indicating the life remaining of a component from the hybrid power generation system 210. Further, the EPMS 205 may determine a prognostic threshold for modifying the charging command.

At step 104, the EPMS 205 may modify battery charging conditions based on the prognostic information. For example, the EPMS 205 may compare the life remaining of the component with a prognostic threshold. When the life remaining of the component reaches the prognostic threshold, the EPMS 205 may modify the battery charging conditions. For instance, the EPMS 205 may modify the battery charging conditions by increasing the minimum and maximum battery charging thresholds for charging the battery 315.

Additionally, and/or alternatively, in some examples, the prognostic information may include system information, such as information regarding land-based hybrid vehicles, marine-based hybrid vehicles, and/or gensets systems. For example, the prognostic information may indicate the component life remaining of a gearbox in the marine-based hybrid vehicle. The EPMS 205 may modify the battery charging conditions based on comparing the prognostic threshold with the component life remaining of the gearbox.

In some instances, the prognostic information may include a prognostic enabled condition. In response to the prognostic enabled condition, the EPMS 205 may modify the battery charging conditions as described above. For example, in response to the prognostic enabled condition, the EPMS 205 may compare the life remaining of the component with a prognostic threshold, and modify the battery charging conditions based on the comparison.

Figure 10:
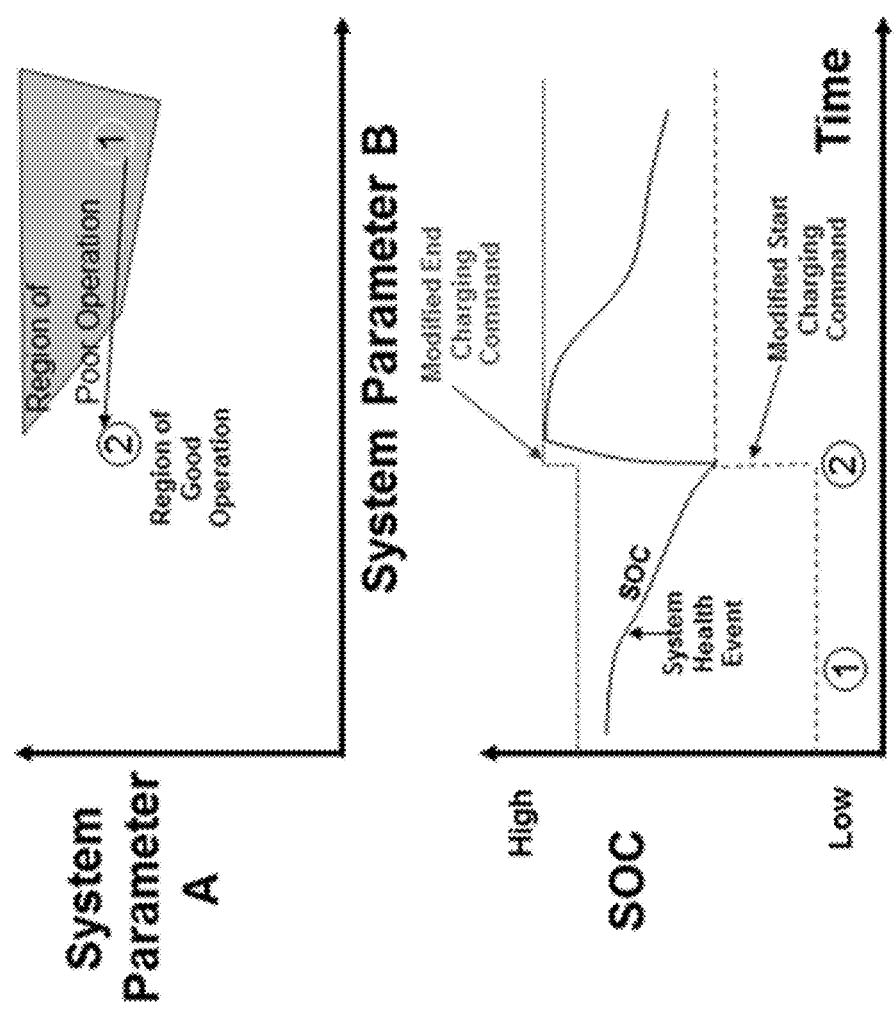
FIG. 10 shows another exemplary representation of charging characteristics of a battery in accordance with one or more embodiments set forth in the disclosure.

In some implementations, the EPMS 205 may receive information, such as system operating condition information. For example, the EPMS 205 may receive system operating condition information indicating system parameters. FIG. 10 shows an example of using the system operating conditions to modify battery conditions and system parameters. The system parameters A and B may include good regions of operation (e.g., normal operating conditions of the system 210) and/or poor regions of operation. For example, at certain torque and engine speeds, the system 210 may operate less efficiently. Thus, to move the system 210 back into the good regions of operation, the EPMS 205 may modify battery charging conditions and/or direct the hybrid power generation system 210 to modify the system parameters.

Figure 11:
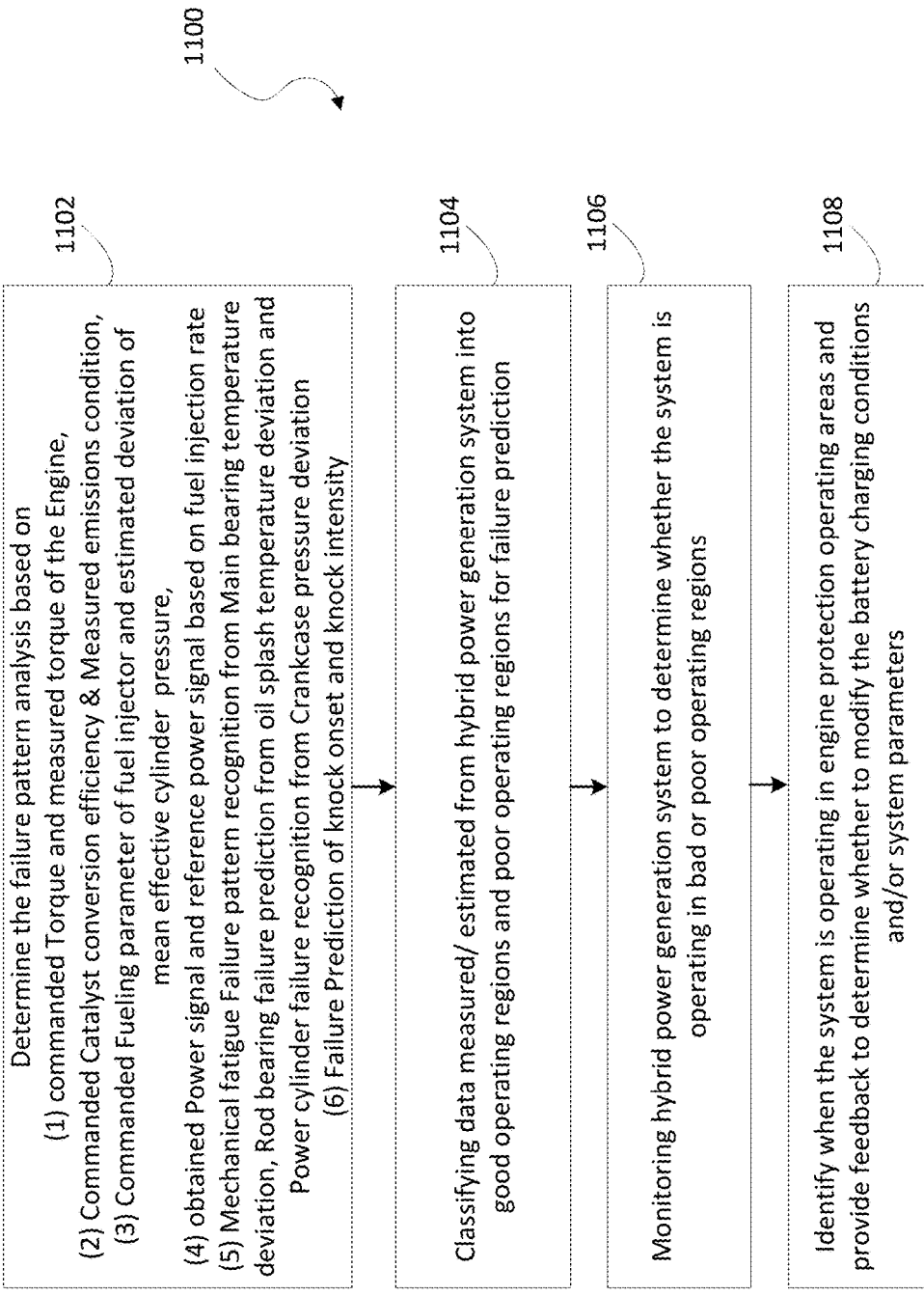
FIG. 11 shows another flow chart illustrating a method for energy management of hybrid power systems in accordance with one or more embodiments set forth in the disclosure.

The EPMS 205 may modify battery charging conditions based on the system operating condition information. In some instances, the engine friction monitoring system, the mechanical fatigue recognition system, the fuel injector cavitation system, and/or the after treatment health management system may transmit system operating condition information. FIG. 11 shows a more detailed version of method 100 for modifying battery charging conditions and system parameters. Referring to FIG. 11, at step 1102, the EPMS 205 may determine the failure pattern analysis based on analyzing the system operating condition information received from step 102.

In some instances, the EPMS 205 may determine the failure pattern based on the indicated commanded torque and the measured torque of the engine. For example, the EPMS 205 may transmit a torque command to the engine/generator 305 to operate at the torque indicated by the torque command. The system for diagnostic monitoring 220 may monitor the torque of the engine/generator 305 to determine whether it is operating at the torque indicated by the torque command. If the engine/generator 305 is not operating at the torque indicated by the torque command, the EPMS 205 may modify the battery charging condition and/or direct the hybrid power generation system 210 to modify one or more system parameters.

In some examples, the EPMS 205 may determine the failure pattern based on the commanded catalyst conversion efficiency and the measure emissions conditions.

In some embodiments, the EPMS 205 may determine the failure pattern based on the fueling parameter of fuel injector and the estimated deviation of mean effective cylinder pressure.

In some instances, the EPMS 205 may determine the failure pattern based on the obtained power signal and the reference power signals based on fuel injection rates.

In some examples, the EPMS 205 may determine the failure pattern based on the mechanical fatigue failure pattern recognition from the main bearing temperature deviation, the rod bearing failure prediction from oil splash temperature deviations, and/or the power cylinder failure recognition from crankcase pressure deviations.

In some embodiments, the EPMS 205 may determine the failure pattern based on the failure prediction of knock onset and knock intensity.

At step 1104, the EPMS 205 may classify the data measured and/or estimated from step 1102 into good operating regions and/or bad operating regions for failure prediction of the system 210, such as the engine/generator 305 and/or a load (e.g., a powertrain system). For example, as shown in FIG. 10, the system may operate in good operating regions and bad operating regions. The EPMS 205 may determine regions where the parameters are within good operating regions and where the parameters are in bad operating regions.

At step 1106, similar to step 102 described in FIG. 1, the EPMS 205 may monitor the hybrid power generation system 210 (e.g., using the system for prognostic monitoring 215 and/or the system for diagnostic monitoring 220) to determine whether the system 210 is operating in bad or poor operating regions. The EPMS 205 may continuously monitor and accumulate data for the system 210.

At step 1108, the EPMS 205 may identify when the system 210 is operating in engine protection operating areas (e.g., when the system 210 is operating in a bad or poor region for a certain time period), and may provide feedback to determine whether to modify the battery charging conditions and/or system parameters. For example, similar to step 104, the EPMS 205 may modify the battery charging conditions when detecting the system 210 is operating in a poor operating region. For instance, referring to FIG. 10, when the EPMS 205 detects the system 210 is operating in a poor operating region, the EPMS 205 may increase the minimum and maximum battery charging thresholds. Additionally, and/or alternatively, similarly to step 108, the EPMS 205 may direct the hybrid power generation system 210 to modify one or more system parameters. For example, the EPMS 205 may direct system 210 to derate the system 210 to prolong the life expectancy of the system 210 (e.g., derate the operation of the engine/generator 305 that is less than its rated maximum capability to prolong the life span of the engine/generator 305).

In some implementations, the hybrid power generation system 210 may be a genset system. The EPMS 205 may use the genset system and one or more batteries 315 (e.g., a plurality of battery racks) to modify the battery charging conditions and/or the system parameters. For example, at step 102, the EPMS 205 may receive information indicating an aggregation of the SOC from one or more, including all, of the battery racks 315 to determine the load demand for starting the genset. Then, at step 104, the EPMS 205 may modify and/or set the thresholds for the battery charging conditions (e.g., charge/discharge rate) to preserve a healthy hybrid genset system. At step 108, the EPMS 205 may direct the hybrid power generation system 210 (e.g., the hybrid genset system) to modify one or more system parameters. For example, the EPMS 205 may estimate conditions for running the engine at higher loads for charging the batteries to improve fuel economy regions. Then, the EPMS 205 may modify the system parameters to increase the life expectancy of the engine 305 (e.g., life to overhaul the engine) by reducing the frequency of the engine start and stop based on recharging the battery 315 (e.g., battery racks).

Embodiments of the present disclosure are described by way of example only, with reference to the accompanying drawings. Further, the following description is merely illustrative in nature and is in no way intended to limit the disclosure, its application, or uses. As used herein, the term "unit" or "module" refers to, be part of, or include an Application Specific Integrated Circuit (ASIC), an electronic circuit, a processor or microprocessor (shared, dedicated, or group) and/or memory (shared, dedicated, or group) that executes one or more software or firmware programs, a combinational logic circuit, and/or other suitable components that provide the described functionality. Thus, while this disclosure includes particular examples and arrangements of the units, the scope of the present system should not be so limited since other modifications will become apparent to the skilled practitioner.

It is to be understood that the above description is intended to be illustrative, and not restrictive. Many other embodiments will be apparent to those of skill in the art upon reading and understanding the above description. For example, it is contemplated that features described in association with one embodiment are optionally employed in addition or as an alternative to features described in associate with another embodiment. The scope of the present disclosure should, therefore, be determined with reference to the appended claims, along with the full scope of equivalents to which such claims are entitled.

What is claimed is:

1. A method for energy management of hybrid energy systems comprising:
receiving, by an energy power management system, information indicating a health event corresponding to a hybrid power generation system comprising a battery;
modifying, by the energy power management system, a battery charging condition based on the information indicating the health event, wherein the battery charging condition comprises one or both of a maximum charging threshold and a minimum charging threshold of the battery, and wherein both of the maximum and minimum charging thresholds are either increased or decreased simultaneously with respect to each other based on the information;
directing, by the energy power management system, the hybrid power generation system to charge the battery based on a state of charge (SOC) of the battery and the modified battery charging condition; and
directing, by the energy power management system, the hybrid power generation system to modify one or more system parameters based on the health event.

2. The method of claim 1, wherein the information indicates one or more system operation conditions, and
wherein the modifying the battery charging condition is based on the one or more system operation conditions.

3. The method of claim 1, wherein the information comprises prognostic information, and
wherein the modifying the battery charging condition is based on the prognostic information.

4. The method of claim 3, wherein the prognostic information comprises a prognostic enabled condition.

5. A method for energy management of hybrid energy systems comprising:
receiving, by an energy power management system, information indicating a health event corresponding to a hybrid power generation system comprising a battery;
modifying, by the energy power management system, a battery charging condition based on the information indicating the health event, wherein the battery charging condition comprises one or both of a maximum charging threshold and a minimum charging threshold of the battery, and wherein both of the maximum and minimum charging thresholds are either increased or decreased simultaneously with respect to each other based on the information; and
directing, by the energy power management system, the hybrid power generation system to charge the battery based on a state of charge (SOC) of the battery and the modified battery charging condition.

6. A hybrid energy system comprising:
a hybrid power generation system comprising a battery; and
an energy power management system coupled to the hybrid power generation system, the energy power management system comprising at least one computing device configured to:
receive information indicating a health event corresponding to the hybrid power generation system;
modify a battery charging condition based on the information indicating the health event, wherein the battery charging condition comprises one or both of a maximum charging threshold and a minimum charging threshold of the battery, and wherein both of the maximum and minimum charging thresholds are either increased or decreased simultaneously with respect to each other based on the information;
direct the hybrid power generation system to charge the battery based on a state of charge (SOC) of the battery and the modified battery charging condition; and
direct the hybrid power generation system to modify one or more system parameters based on the health event.

7. The hybrid energy system of claim 6, wherein the information indicates one or more system operation conditions, and
wherein the battery charging condition is modified based on the one or more system operation conditions.

8. The hybrid energy system of claim 6, wherein the information comprises prognostic information, and
wherein the battery charging condition is modified based on the prognostic information.

9. The hybrid energy system of claim 8, wherein the prognostic information comprises a prognostic enabled condition.

10. The hybrid energy system of claim 6, wherein the information comprises learned and look-ahead information, and
wherein the battery charging condition is modified based on the learned and look-ahead information.

11. The hybrid energy system of claim 6, wherein the information comprises current and prior system health information, and
wherein the battery charging condition is modified based on the current and prior system health information.

12. The hybrid energy system of claim 6, wherein the information comprises current and prior charging system information, and
wherein the battery charging condition is modified based on the current and prior charging system information.

13. The hybrid energy system of claim 6, wherein the information comprises external information, and
wherein the battery charging condition is modified based on the external information.

14. The hybrid energy system of claim 8, wherein the information further comprises diagnostic information, and
wherein the battery charging condition is also modified based on the diagnostic information.

* * * * *